(12) United States Patent
Kelman et al.

(10) Patent No.: US 9,793,104 B2
(45) Date of Patent: Oct. 17, 2017

(54) PREPARING A SEMICONDUCTOR SURFACE FOR EPITAXIAL DEPOSITION

(71) Applicant: AIXTRON SE, Herzogenrath (DE)

(72) Inventors: Maxim Kelman, Mountain View, CA (US); Shahab Khandan, Pleasanton, CA (US); Scott Dunham, Fremont, CA (US); Tac van Huynh, Fremont, CA (US); Kenneth B. K. Teo, Great Cambourne (GB)

(73) Assignee: AIXTRON SE, Herzogenrath (DE)

( * ) Notice: Subject to any disclaimer, the term of this patent is extended or adjusted under 35 U.S.C. 154(b) by 49 days.

(21) Appl. No.: 15/008,663

(22) Filed: Jan. 28, 2016

(65) Prior Publication Data

US 2016/0225608 A1    Aug. 4, 2016

Related U.S. Application Data

(60) Provisional application No. 62/109,367, filed on Jan. 29, 2015.

(51) Int. Cl.
| | |
|---|---|
| *H01L 21/02* | (2006.01) |
| *H01L 21/67* | (2006.01) |
| *C23C 16/02* | (2006.01) |

(52) U.S. Cl.
CPC .... *H01L 21/02049* (2013.01); *C23C 16/0236* (2013.01); *C23C 16/0245* (2013.01); *H01L 21/67207* (2013.01); *H01L 21/0237* (2013.01); *H01L 21/02521* (2013.01); *H01L 21/02658* (2013.01); *H01L 21/67103* (2013.01)

(58) Field of Classification Search
CPC combination set(s) only.
See application file for complete search history.

(56) References Cited

U.S. PATENT DOCUMENTS

| | | | |
|---|---|---|---|
| 5,306,671 | A | 4/1994 | Ogawa et al. |
| 5,413,670 | A | 5/1995 | Langan et al. |
| 5,968,279 | A | 10/1999 | MacLeish et al. |
| 6,313,042 | B1 | 11/2001 | Cohen et al. |
| 7,018,940 | B2 | 3/2006 | Dunham |
| 7,101,435 | B2 | 9/2006 | Zhang et al. |
| 7,416,989 | B1 | 8/2008 | Lin et al. |
| 7,955,510 | B2 | 6/2011 | Arghavani et al. |
| 8,263,468 | B2 | 9/2012 | Adam et al. |
| 8,336,488 | B2 | 12/2012 | Chen et al. |
| 8,398,813 | B2 | 3/2013 | Kobayashi et al. |
| 8,399,360 | B1 | 3/2013 | Miller et al. |
| 2004/0237881 | A1 | 12/2004 | Zhang et al. |

(Continued)

FOREIGN PATENT DOCUMENTS

| | | |
|---|---|---|
| EP | 1081754 A2 | 3/2001 |
| JP | S 6245119 A | 2/1987 |

(Continued)

OTHER PUBLICATIONS

U.S. Appl. No. 14/926,612, filed Oct. 29, 2015, Dunham et al.

*Primary Examiner* — Mamadou Diallo
(74) *Attorney, Agent, or Firm* — Foley & Lardner LLP

(57) ABSTRACT

Provided is a method of epitaxial deposition, which involves dry-etching a semiconductor substrate with a fluorine containing species and exposing the dry-etched substrate to hydrogen atoms, prior to epitaxially depositing a semiconductor layer to the surface of the substrate.

20 Claims, 4 Drawing Sheets

(56) References Cited

U.S. PATENT DOCUMENTS

| | | |
|---|---|---|
| 2005/0150455 A1 | 7/2005 | Kobayashi et al. |
| 2008/0035608 A1 | 2/2008 | Thomas et al. |
| 2011/0263104 A1 | 10/2011 | Adam et al. |
| 2012/0003825 A1* | 1/2012 | Dip .................. H01L 21/02381 438/493 |
| 2012/0031559 A1 | 2/2012 | Dhindsa et al. |
| 2012/0298302 A1 | 11/2012 | Xia et al. |
| 2013/0059448 A1 | 3/2013 | Marakhtanov et al. |
| 2014/0017357 A1 | 1/2014 | Aaltonen et al. |

FOREIGN PATENT DOCUMENTS

| | | |
|---|---|---|
| JP | 11-162957 A | 6/1999 |
| JP | 2008-026302 A | 2/2008 |

* cited by examiner

PREPARING A SEMICONDUCTOR SURFACE FOR EPITAXIAL DEPOSITION

RELATED APPLICATIONS

The present claims priority to U.S. provisional application No. 62/109,367 filed Jan. 29, 2015, which is incorporated herein by reference in its entirety.

FIELD

The present disclosure relates in general to semiconductor technology and in particular, to a method and an apparatus for preparing a semiconductor surface for epitaxial deposition.

SUMMARY

One embodiment is a method of epitaxial deposition comprising a) obtaining a semiconductor substrate having i) a bulk semiconductor and ii) a surface oxide layer over the bulk semiconductor; b) dry-etching the substrate with a fluorine containing species to remove the surface oxide layer and thereby expose a surface of the bulk semiconductor; c) exposing the surface of the bulk semiconductor to hydrogen atoms; and d) then epitaxially depositing a semiconductor layer on the surface of the bulk semiconductor.

Another embodiment is a cleaning chamber comprising: a) a substrate holder comprising a heater, the substrate holder is configured to hold a substrate; b) a source of a fluorine containing gas; c) a showerhead electrode in fluid communication with the source of the fluorine containing gas, the showerhead electrode is positioned parallel to the substrate holder; d) a grounded electrode assembly positioned parallel the substrate holder between the showerhead electrode and the substrate holder, said grounded electrode assembly comprises i) a grounded electrode comprising aluminum and ii) a heat shield comprising alumina, said heat shield is not in direct contact with the grounded electrode; wherein the gap between the electrode and heat shield is no greater than 3 mm; e) a power source in electrical contact with the showerhead electrode, wherein the chamber is configured to generate a plasma between the showerhead electrode and the grounded electrode, while having no direct plasma in direct contact with the substrate; wherein the grounded electrode assembly is penetrable for atomic products of decomposition of the fluorine containing gas by the plasma, while minimizing penetration of ionic products of decomposition of the fluorine containing gas by the plasma.

FIGURES

Figure 1:
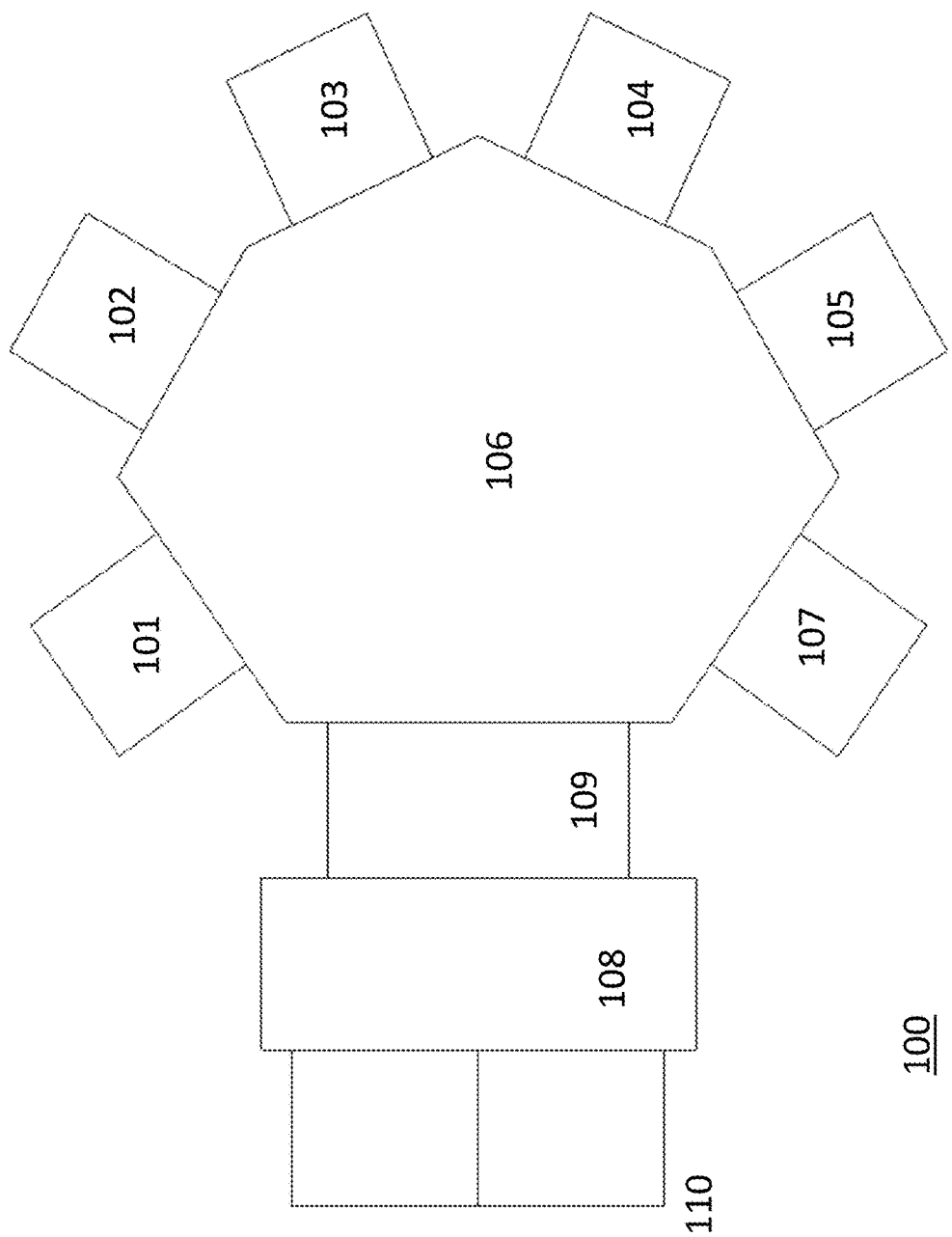

FIG. 1 schematically illustrates an epitaxial deposition apparatus which includes a substrate cleaning module.

Figure 2:
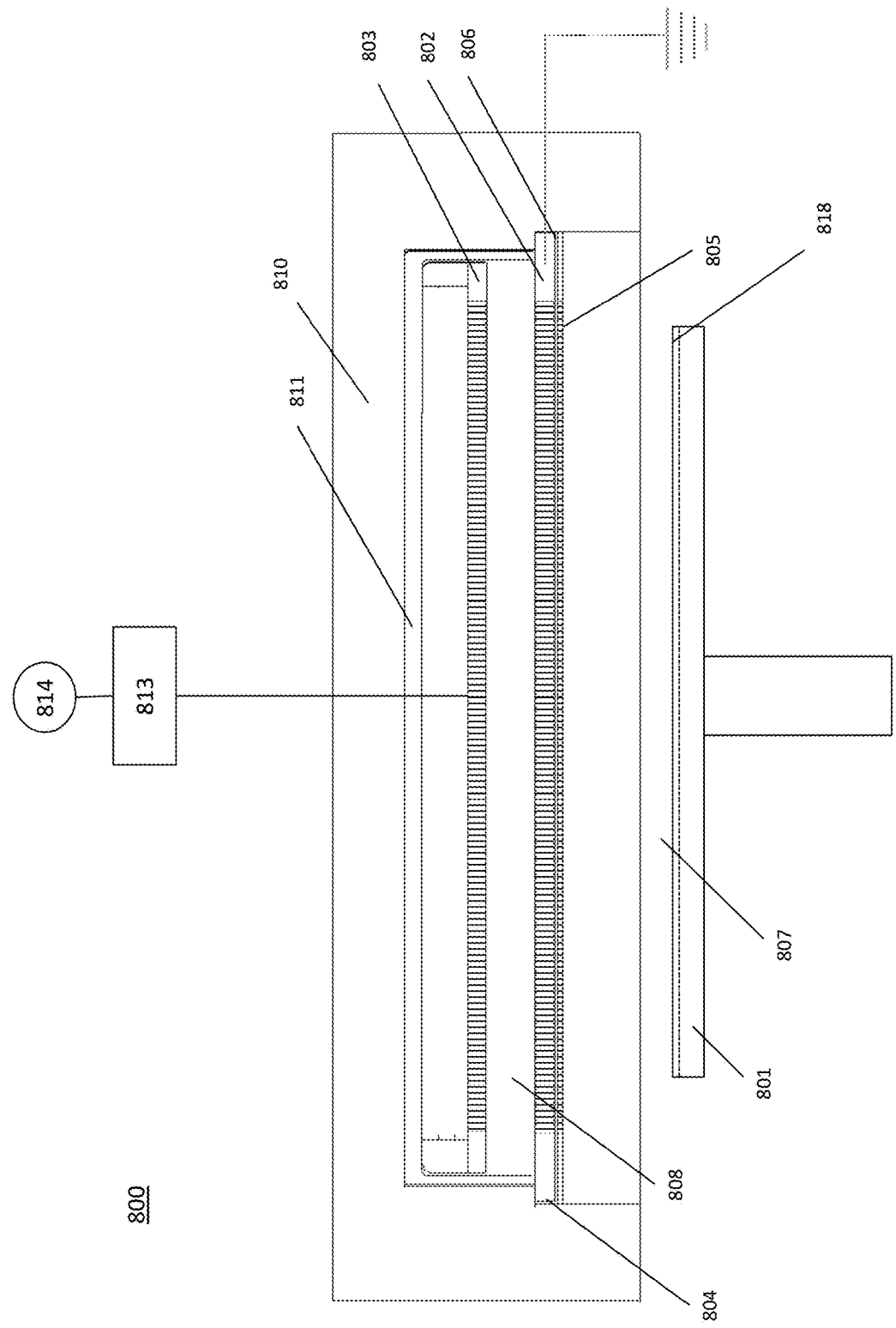

FIG. 2 schematically depicts a cross-section of a plasma cleaning module.

Figure 3:
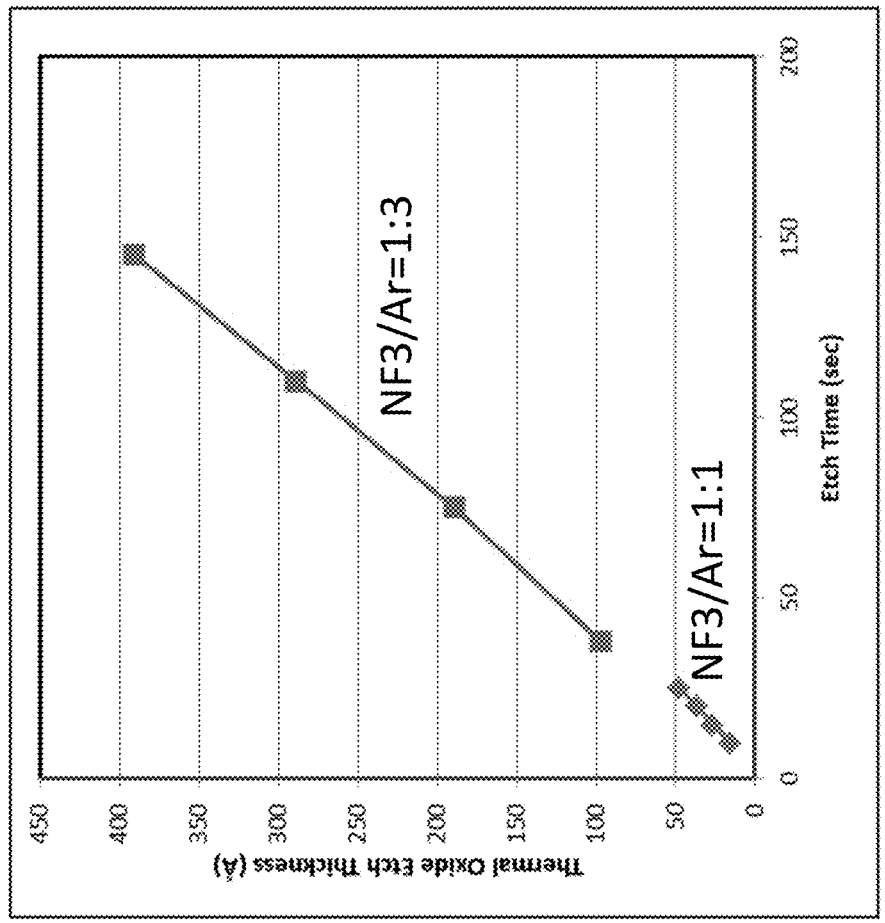

FIG. 3 presents tests results for $NF_3$ plasma cleaning.

Figure 4:
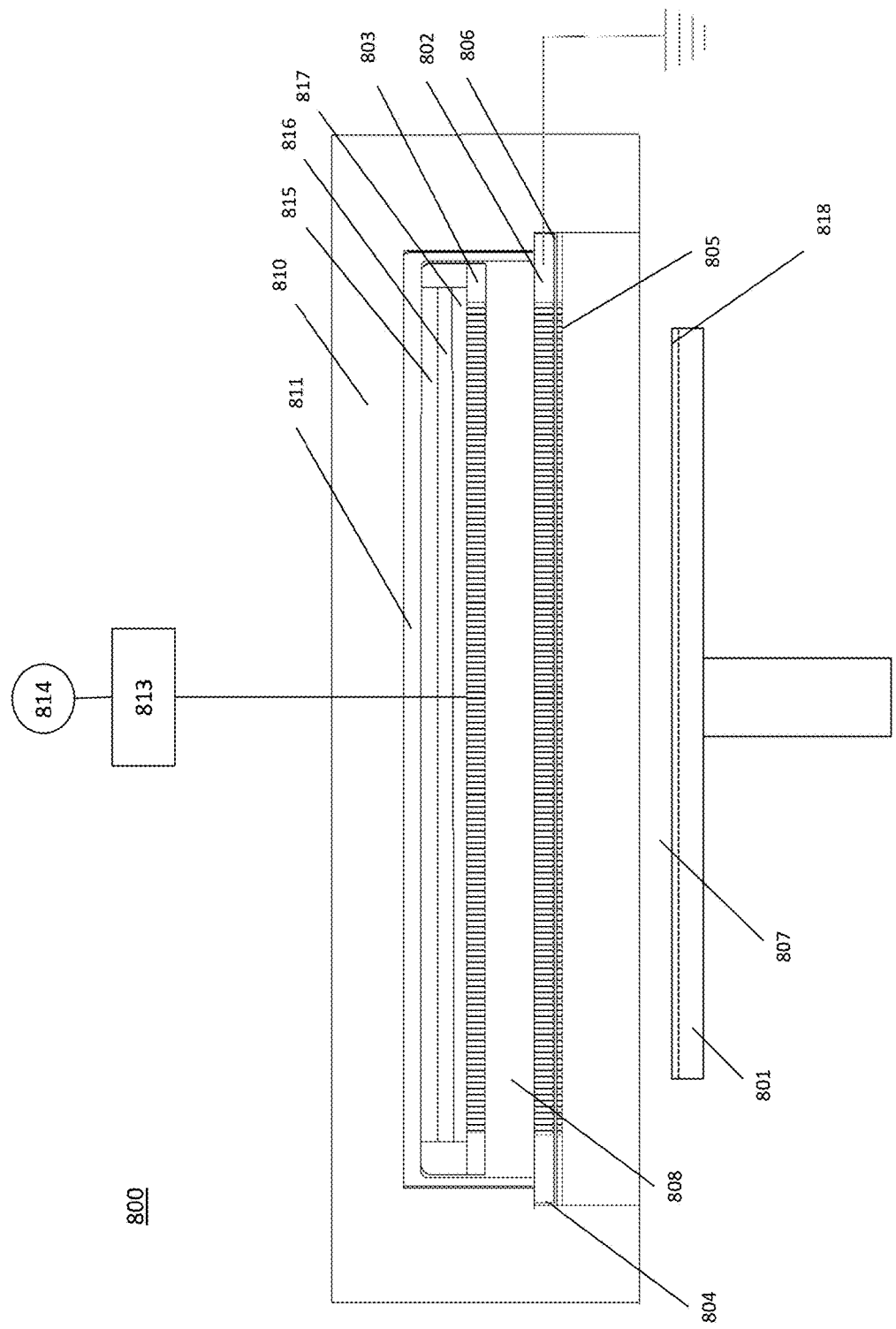

FIG. 4 schematically depicts a cross-section of a plasma cleaning module with a multi-plenum configuration.

DETAILED DESCRIPTION

Unless otherwise specified, "a" or "an" means one or more.

Documents

The following documents may be helpful for understanding the present disclosure: U.S. Pat. Nos. 7,955,510; 8,336,488; 6,313,042; 8,399,360; 7,416,989; 5,968,279; 5,413,670; 5,306,671; 8,399,360; US patent application publications nos. 20120298302; 2008035608; 2013059448; 2012031559; 2011263104; 2004237881; 2005150455; 2014017357; European patent document no. EP1081754; Japanese patent documents nos. JP200826302; JP 19970328022; JPS 6245119.

Disclosure

A typical integrated process flow for an epitaxial layer formation on a semiconductor wafer, such as a silicon wafer, may involve the following steps: a) Contamination removal from the wafer's surface: this step typically involves a wet cleaning process. b) Native oxide removal using a dilute HF solution. c) High temperature $H_2$ bake in a epitaxial growth chamber. While the exact mechanism is unknown, removing this step results in a poor morphology of the epitaxial layer. It is assumed that this step removes adsorbed hydrocarbons and reconstructs the surface into the configuration needed for high quality epitaxial growth with hydrogen surface termination. d) epitaxial layer growth. In a typical process flow, steps a) and b) are carried out in a separate tool, whereas steps c)-d) are performed in a epitaxial growth chamber.

The existing process may result in one or more of the following drawbacks: 1) the use of HF solution to remove native oxide (step b) is acceptable for a blanket wafer. For a wafer containing a patterned oxide, such as $SiO_2$, that may define a dimension of device for selective area epitaxy, use of the HF solution may result in unacceptable CD (critical dimension) loss. For example, in certain cases, the HF solution treatment may increase the critical dimension from 5 nm to 15 nm. 2) After being exposed to the HF solution, the wafer surface becomes hydrophobic and therefore attractive to adventitious hydrocarbons that adsorb on the surface. During the high temperature bake, these hydrocarbons may carbonize and degrade the quality of the epilayer. 3) High temperature hydrogen bake is not compatible with an integrated complimentary metal-oxide-semiconductor (CMOS) process because at the temperatures used (>850° C.), typical dopants of the wafer's semiconductor may diffuse, thereby, degrading the quality of devices already present on the wafer.

To address these drawbacks, the inventors developed the discussed below method and apparatus.

The method may involve dry-etching a semiconductor substrate, which has a bulk semiconductor and a surface oxide layer, over the bulk semiconductor, with a fluorine containing species to remove at least a portion of the surface oxide layer and thereby expose a surface of the bulk semiconductor. The surface of the bulk semiconductor then may be exposed to hydrogen atoms. Following such exposure, a semiconductor layer may be epitaxially deposited over the surface of the bulk semiconductor. Preferably, the surface of the bulk semiconductor is unexposed to contaminating species, such as water vapor, oxydegn or adventitious carbon after the dry etching and before the epitaxial deposition. This may be accomplished, for example, by keeping the substrate after the dry etching and before the epitaxial deposition under vacuum.

Upon the dry-etching, the exposed surface of the bulk semiconductor may become fluorine terminated. Upon the exposure to the hydrogen atoms, the exposed surface of the bulk semiconductor may become hydrogen terminated. For example, when the bulk semiconductor is silicon, the surface may be terminated with Si—H groups. Applicants believe that the surface of the bulk semiconductor treated with atomic hydrogen may be amenable for epitaxial deposition of a semiconductor layer, such as a Group III-V semiconductor layer.

The substrate may be a Group IV semiconductor substrate, such as a silicon substrate or a germanium substrate.

The surface oxide layer may be, for example, a native oxide layer, a thermally grown oxide layer or a combination of a native oxide and a thermally grown oxide. A particular chemical composition of the oxide layer may depend on a chemical composition of the bulk semiconductor. For example, when the bulk semiconductor is silicon, the surface oxide layer may be a silicon oxide layer. When the bulk semiconductor is germanium, the surface oxide layer may be a germanium oxide layer.

In some embodiments, the substrate may be a group III-V semiconductor substrate, i.e. a substrate comprising one or more of AlN, AlP, AlAs, AlSb, GaN, GaP, GaAs, GaSb, InN, InP, InAs, InSb, $Al_xGa_{1-x}As$, $In_xGa_{1-x}As$, $In_xGa_{1-x}P$, $Al_xIn_{1-x}As$, $Al_xIn_{1-x}Sb$, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, InAlAsN, GaAsSbN, GaInNAsSb, and GaInAsSbP. In some embodiments, the substrate may be a group II-VI semiconductor substrate, i.e. a substrate comprising one or more of CdSe, CdS, CdTe, ZnO, ZnSe, ZnS, ZnTe, CdZnTe, HgCdTe, HgZnTe, and HgZnSe.

In some embodiments, the surface oxide layer may have areas having different oxide thickness. In such case, the dry etching with the fluorine containing species may remove the oxide (and expose a surface of the bulk semiconductor) in an area of the substrate with a lower oxide thickness, while preserving at least some oxide (and thus not expose a surface of the bulk semiconductor) in an area of the substrate with a higher oxide thickness. The exposure to hydrogen atoms and a subsequent epitaxial depositing of a semiconductor layer will be limited to an area or areas of the substrate, which had the lower oxide thickness and for which the surface of the bulk semiconductor was exposed.

For example, in some embodiments, the surface oxide layer may be a patterned oxide layer having one or more features with a lower oxide thickness, in an area of the substrate where the epitaxial depositing is desired and, one or more features with a higher oxide thickness, in an area of the substrate, where the epitaxial deposition is not desired. Methods of generating patterned oxide layers with feature sizes ranging from several centimeters to several nanometers are known in the art.

Dry etching with fluorine containing species may allow for controllable removal of oxide layers from the wafer surface, where the removal rate can be controlled by the concentration and type of fluorinated species in the ambient.

Dry etching of silicon- containing layers can be accomplished by fluorinated species such as $NF_3$, HF, $ClF_3$, $SF_6$, $CF_4$, $XeF_2$ and others. Some of these species, such as $NF_3$, $CF_4$ and $SF_6$ require activation by a DC or AC plasma discharge whereas some of the fluorinated species such as HF, $ClF_3$ and $XeF_2$ are effective etchants without activation.

Plasma decomposition of fluorine containing species results in formation of multiple charged and neutral species which can bombard the wafer surface degrading its crystalline quality. It may be beneficial for subsequent epitaxial deposition process to minimize the amount of crystal damage. In some embodiments, the fluorine containing species used in the dry-etching may be predominantly radical fluorine containing species, which means that a concentration of the radical fluorine containing species reaching the surface of the substrate may be substantially higher than a concentration of ionic fluorine containing species (which may be also the product of decomposing a fluorine containing gas, by e.g. plasma). For example, the concentration of radical fluorine containing species reaching the surface of the substrate may be at least 10 times or at least 20 times or at least 50 times or at least 100 times or at least 200 times or at least 500 times or at least 1000 times higher than the concentration of fluorine containing ions reaching the substrate.

The hydrogen atoms may be produced by decomposing $H_2$. Such decomposing may be performed by exposing $H_2$ to plasma, which may be, for example, DC plasma or AC plasma. Preferably, when the substrate's surface is exposed to the hydrogen atoms, it is not exposed to hydrogen ions, which may be a product of decomposing $H_2$. In other words, it may mean that a concentration of hydrogen atoms that reaches the surface of the substrate is much higher than a concentration of hydrogen ions reaching the substrate. For example, the concentration of hydrogen atoms reaching the surface of the substrate may be at least 10 times or at least 20 times or at least 50 times or at least 100 times or at least 200 times or at least 500 times or at least 1000 times higher than the concentration of hydrogen ions reaching the substrate.

Preferably, when plasma, such as DC plasma or AC plasma, is used for producing the fluorine containing species and/or hydrogen atoms, no direct plasma is in direct contact with the surface of the substrate. The term "AC plasma" includes plasma generated with a power source having a frequency ranging from 3 kHz to 300 GHz or from 3 kHz to 100 GHz or from 3 kHz to 300 MHz or from 3 kHz to 100 MHz or from 3 kHz to 300 kHz or from 3 kHz to 100 kHz any value within these ranges.

The power of plasma discharge used during the dry-etching or the exposing the substrate to the atomic hydrogen may depend on a number of parameters, which may include a power of a power source. In some embodiments, the power of plasma may be from 10 W to 2000 W or from 20 W to 1000 W or from 40 W to 500 W or from 60 W to 200 W or any value or subrange within these ranges. The power of plasma used during the dry-etching or the exposing the substrate to the atomic hydrogen may be the same or different.

In some embodiments, plasma used for decomposing a fluorine containing gas, such as $NF_3$, during the dry-etching and/or for decomposing molecular hydrogen for producing the atomic hydrogen may be such that no direct plasma is in direct contact with the substrate. This may be accomplished by positioning a grounded electrode, which may be penetrable to the fluorine containing species and/or atomic hydrogen, between the substrate and a power electrode, which may be, for example, a showerhead electrode, which is electrically connected to a plasma power source, such as a DC power source or an AC power source. In such case, a direct plasma may be generated between the power electrode and the grounded electrode. At the same time, there will be no direct plasma between the grounded electrode and the substrate. Therefore, there will be no direct plasma in direct contact with the substrate.

In some embodiments, plasma used for decomposing a fluorine containing gas, such as $NF_3$, during the dry-etching and/or for decomposing molecular hydrogen for producing the atomic hydrogen may be such that there is direct plasma in direct contact with the substrate. This may be accomplished by positioning the substrate between a grounded electrode and a power electrode, which is electrically connected to a plasma power source, such as a DC power source or an AC power source. In such a case, a direct plasma may be generated between the power electrode and the grounded electrode and the substrate will be exposed to such plasma. The grounded electrode in such configuration may serve as a heater in a thermal contact with the substrate. The heater may be used for heating the substrate to a desired temperature during the dry-etching or the exposure to hydrogen atoms. The heater may, for example, contain a grounded mesh, which will act as the grounded electrode, and an electrically insulating surface above this grounded mesh. In such a case, the substrate may be placed on the electrically insulating surface.

During the dry etching with the fluorine containing species, the temperature of the substrate may be from 130° C. to 650° C. or from 200° C. to 650° C. or from 130° C. to 600° C. or from 200° C. to 600° C. or from 130° C. to 550° C. or from 200° C. to 550° C. or from 130° C. to 500° C. or from 200° C. to 500° C. or from 130° C. to 450° C. or from 200° C. to 450° C. or from 130° C. to 425° C. or from 200° C. to 425° C. or any subrange within these ranges. In some embodiments, the temperature of the substrate during the dry etching with the fluorine containing species may be below 650° C. or below 625° C. or below 600° C. or below 575° C. or below 550° C. or below 525° C. or below 500° C. or below 475° C. or below 450° C. or below 425° C. or below 400° C. The time of the dry-etching may depend on a number of parameters, which may include a thickness of oxide desired to be etched. In some embodiments, the time of the dry-etching may be from 2 sec to 500 sec or from 5 sec to 200 sec or any value or subrange within these ranges.

During the exposure of the substrate to hydrogen atoms, the temperature of the substrate may be at least or below 650° C. or at least or below 625° C. or at least or below 600° C. or at least below 575° C. or at least or below 550° C. or at least or below 525° C. or at least or below 500° C. The time of the exposure of the substrate to the hydrogen atoms may depend on a number of parameters, such as a temperature of the substrate, pressure, plasma power and frequency. In some embodiments, the time of the exposure of the substrate to the hydrogen atoms may be, for example, from 10 seconds to 10 minutes or from 1 minute to 10 minutes or from 2 minutes to 8 minutes or from 3 minutes to 6 minutes or any value within this ranges. Overall, the time of exposure to hydrogen atoms may depend on several parameters, such as a distance between the substrate and a power electrode. The time of exposure to hydrogen atoms may depend on whether the substrate is placed on a floating heater or a grounded heater surface. A grounded heater in plasma may provide electrical bias on the substrate attracting greater movement of hydrogen atoms towards substrate. This attraction may cause larger physical hitting of the hydrogen atoms onto the substrate. A floating heater on the other hand doesn't provide such additional attraction.

In some embodiments, the substrate may be exposed to hydrogen atoms both before the dry etching with the fluorine containing species and after the dry etching. The temperature of the substrate during the before and after exposures may be the same or different.

In some embodiments, following the exposure of the dry etched substrate to the hydrogen atoms, the substrate may be cooled down before being heated again for the epitaxial deposition. For example, the substrate may be cooled down to 250° C. or 225° C. or 200° C. or 190° C. or 180° C. or 170° C. or 160° C. or 150° C. or 140 or 130° C. or 120° C. or 110° C. or 100° C. or 90° C. or 80° C. or 70° C. or 60° C. or 50° C. or 40° C. or 30° C. or 20° C. or any temperature between 20° C. and 250° C. In some embodiments, the substrate may be cooled down to an ambient temperature.

The epitaxially deposited layer may be, for example, a group IV semiconductor layer or a group III-V semiconductor layer or a group II-VI semiconductor layer Examples of group IV semiconductors include Si, Ge, $Si_{1-x}Ge_x$, SiC. Examples of group III-V semiconductors include AlN, AlP, AlAs, AlSb, GaN, GaP, GaAs, GaSb, InN, InP, InAs, InSb, $Al_xGa_{1-x}As$, $In_xGa_{1-x}As$, $In_xGa_{1-x}P$, $Al_xIn_{1-x}As$, $Al_xIn_{1-x}Sb$, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, InAlAsN, GaAsSbN, GaInNAsSb, GaInAsSbP. Examples of group II-VI semiconductors include CdSe, CdS, CdTe, ZnO, ZnSe, ZnS, ZnTe, CdZnTe, HgCdTe, HgZnTe, HgZnSe.

Methods of depositing epitaxial semiconductor layers are known in the art, see e.g. Mercklings et al., Journal of Applied Physics 115 023710 (2014).

The temperature of the substrate during the epitaxial depositing may be, for example, from 300° C. to 700° C. or from 350° C. to 675° C. or any value or subrange within these ranges. In some embodiments, the temperature of the substrate from the start of the dry etching with the fluorine containing species till the end of the epitaxial deposition may be at least 130° C. or at least 140° C. or at least 150° C. or at least 160° C. or at least 170° C. or at least 180° C. or at least 190° C. or at least 200° C.

Yet in some embodiments, the substrate may cool down to room temperature before the epitaxial deposition.

In some embodiments, the temperature of the substrate from the start of the dry etching with the fluorine containing species till the end of the epitaxial deposition may be no greater or less than 675° C. or no greater or less than 650° C. or no greater or less than 625° C. or no greater or less than 600° C. or no greater or less than 575° C.

Preferably after the substrate is exposed to hydrogen atoms and before depositing an epitaxial layer on the substrate, the substrate is not exposed to water vapor, oxygen or adventitious carbon. This may be accomplished, for example, by keeping the substrate under vacuum after the end of the exposure to the hydrogen atoms and before depositing the epitaxial layer on the substrate. The vacuum may have, for example, a pressure between 10 mTorr and 100 Torr or between 25 mTorr and 100 Torr or any value or subrange within these ranges.

In some embodiments, the method may be performed in an apparatus comprising i) a cleaning module; ii) an epitaxial deposition module and iii) a transfer module in direct contact with both the cleaning module and the epitaxial deposition module. In such apparatus, the dry etching with the fluorine containing species and the exposing to the hydrogen atoms may be performed in the cleaning module, while the epitaxial deposition of the semiconductor layer may be performed in the epitaxial deposition module. The transfer module may be configured to transfer the substrate from the cleaning module to the epitaxial deposition module. Preferably, such transfer does not expose the substrate to water vapor, oxygen or adventitious carbon. In some embodiments, the apparatus may comprise more than one epitaxial deposition modules, each of which may be in direct contact with the transfer module. In such a case, the transfer module may be configured to transfer a substrate after the dry etching and the hydrogen exposure in the cleaning module to each (or one or more) of the epitaxial deposition modules. In some embodiments, the apparatus may also include one or more loading modules, each of which is in direct contact with the transfer module. A loading module may be configured to transfer a semiconductor substrate, for which epitaxial deposition is desired, from an atmospheric pressure outside environment to a lower pressure environment of the transfer module and/or to transfer a semiconductor substrate treated in one or more modules of the apparatus, such a substrate with an epitaxially deposited layer, from the lower pressure environment of the transfer module back to the atmospheric pressure outside environment. The transfer module may be further configured to transfer a substrate introduced from the outside environment through the loading module from the loading module to the cleaning module. The transfer module may be also configured to transfer a substrate with an epitaxial semiconductor layer deposited in one of the epitaxial deposition modules from that deposition module to the loading module in order to move the substrate back to the outside environment through the loading module.

Preferably, the apparatus is configured to process so that the temperature of the semiconductor substrate while it is in the cleaning module, the transfer module or the epitaxial deposition module is no greater or less than 650° C. or no greater or less than 640° C. or no greater or less than 630° C. or no greater or less than 620° C. or no greater or less than 610° C. or no greater or less than 600° C. or no greater or less than 590° C. or no greater or less than 580° C. or no greater or less than 570° C. or no greater or less than 560° C. or no greater or less than 550° C. Preferably, the apparatus is configured to process so that the temperature of the semiconductor substrate while it is in the cleaning module, the transfer module or the epitaxial deposition module is no less or greater than 130° C. or no less or greater than 140° C. or no less or greater than 150° C. or no less or greater than 160° C. or no less or greater than 170° C. or no less or greater than 180° C. or no less or greater than 190° C. or no less or greater than 200° C. or no less or greater than 210° C. or no less or greater than 220° C. or no less or greater than 230° C.

The apparatus may be such that after being heated to a first elevated temperature during the exposure to hydrogen atoms in the cleaning module, the substrate may be cooled down in the transfer module and then heated again in the epitaxial deposition module.

FIG. 1 schematically illustrates an apparatus 100, which includes cleaning modules 101 and 107, four epitaxial deposition modules 102, 103, 104 and 105 as well as a transfer module 106. Each of cleaning modules 101 and 107 as well as epitaxial deposition modules 102-105 are in direct contact with transfer module 106, which is configured to transfer a semiconductor substrate, which was dry etched by a fluorine containing species and exposed to hydrogen atoms in cleaning module 101 or 107, from cleaning module 101 or 107 to one of epitaxial deposition modules 102-105. Each of cleaning modules 101 and 107 as well as each of epitaxial deposition modules 102-105 is in direct contact with transfer module 106, which may mean that each of cleaning modules 101 and 107 as well as each of epitaxial deposition modules 102-105 has a common surface with transfer module 106. Such common surface may have an opening, through which a substrate may be moved from/to transfer module 106 to/from a particular cleaning or epitaxial deposition module. An opening between transfer module 106 and a particular cleaning or epitaxial deposition module may include a valve, which may be used for opening/closing an inner volume of transfer module 106 to/from an inner volume of the cleaning or epitaxial deposition module. Although FIG. 1 shows two cleaning modules and four epitaxial deposition modules the actual number of cleaning modules and epitaxial deposition modules may be more or less than that shown in FIG. 1. The inner volume of transfer module 106, cleaning module(s), such as modules 101 and 107, and epitaxial deposition module(s), such as modules 102-105, is preferably under vacuum with a pressure, for example, between 25 mTorr and 100 Torr. The apparatus 100 may also include a loading module 108 configured to bring a substrate from outside atmospheric pressure to the inner space of the transfer module. The loading module 108 may have a common surface with the transfer module 106. This common surface may have a door 109 which may open (or close) the inner volume of the transfer module 106 to the inner volume of the loading module 108. The loading module 108 may also have an outside door 110, which may open (or close) the inner volume of the loading module 108 to an outside atmosphere. When one wants to load a substrate in the apparatus 100, he or she closes door 109; brings the pressure in the inner volume of the loading module to atmospheric pressure by for example, purging it with a gas, such $N_2$; then, one opens the outside door 110; brings the substrate into the inner volume of the loading module 108; closes the outside door 110; evacuates the inner volume of the loading module 108 to a pressure similar to the one in the inner volume of the transfer module 108 and opens the door 109 to bring the substrate in the inner volume of the transfer module 106. To unload a substrate from the apparatus 100, one brings the substrate from the inner volume of the transfer module 106 the inner volume of the loading module 108 when the door 109 is open and the door 110 is closed; closes the door 109; purges the inner volume of the loading module 108 to the atmospheric pressure; opens the door 110 to take the substrate out. Transfer module 108 may include a substrate handler for transferring one or more substrates. The apparatus 100 may be used for loading and/or unloading through a loading module a plurality of substrates in a batch format. At the same time, treatment in cleaning module 101 or 107 or epitaxial deposition in a deposition module, such as modules 102-105, is performed for an individual substrate.

FIG. 2 schematically depicts a cross-sectional view of cleaning chamber or module 800.

Such cleaning chamber or module may include substrate holder 801 configured to hold semiconductor substrate to be cleaned 818. Substrate holder 801 may contain a heater (not shown in FIG. 2), such as a resistive heater, which may be in thermal connection with the substrate and therefore configured to raise a temperature of the substrate to a value desired for a particular cleaning process. Cleaning chamber or module 800 may also include showerhead electrode 803, which may be positioned substantially parallel or parallel to substrate holder 801 (and a surface of substrate 818) and a grounded electrode assembly 802 positioned between showerhead electrode 803 and substrate holder 801, preferably substantially parallel or parallel to substrate holder 801 (and the surface of substrate 818) Showerhead electrodes are known in the art, see e.g. U.S. Pat. No. 7,018,940. Showerhead electrode 803 may be in fluid communication with a source of gas (not shown in FIG. 2) to be used in cleaning chamber or module 800 for cleaning/treating/etching substrate 818. For example, in some embodiments, showerhead electrode 803 may be in fluid communication with a source of a fluorine containing gas, such as $NF_3$. Yet in some embodiments, showerhead electrode 803 may be also in fluid communication with a source of hydrogen gas. Showerhead electrode 803 may contain a cooling agent configured to cool showerhead electrode 803 during its operation. Such a cooling agent may be, for example, water circulating through showerhead electrode 803.

Grounded electrode assembly 802 may include grounded electrode 804 and heat shield 805. As some of the pre-clean processes may require an elevated substrate temperature, the temperature of heat shield 805 may exceed the service temperature of the material of grounded electrode 804. To reduce the temperature of grounded electrode 804, heat shield 805 may be made of a refractory material. Preferably, grounded electrode 804 and its heat shield 805 are made from materials compatible with hydrogen and fluorine process chemistry used when the substrate is dry etched with a fluorine containing species and exposed to hydrogen atoms (radicals). For example, in some embodiments, ground electrode 804 may be made of aluminum, while heat shield 805 may be made of alumina. In some embodiments, grounded electrode 804 may be not in direct physical contact with heat shield 805. For example, there may be gap 806 between grounded electrode 804 and heat shield 805 of no greater 3 mm or not greater 2.5 mm or no greater 2 mm or no greater than 1.5 mm or nor greater 1 mm. Cleaning chamber or module 800 may also include power source 814, which may be for example, a DC power source or an AC power source, in electrical contact with showerhead electrode 803. For example, FIG. 2 shows optional match 813 for electrically connecting power source 814 to showerhead electrode 803. Match 813 may minimize the power delivery efficiency, such as RF power delivery efficiency, from power source 814 to plasma in area 808 as well as minimize a power reflected by chamber or module 800 back to power source 814.

Cleaning chamber or module 800 may be configured to generate a plasma, which may be, for example, an AC plasma or a DC plasma in area 808 between showerhead electrode 803 and grounded electrode 804, while having no direct plasma in area 807 between grounded electrode assembly 802 and substrate holder 801 (or substrate 818), which means no direct plasma is in direct contact with substrate 818 positioned on substrate holder 801. The generated plasma may decompose a gas introduced through showerhead electrode 803. For example, the generated plasma may decompose a fluorine containing gas or hydrogen introduced through showerhead electrode 803. Preferably, grounded electrode assembly 802 is penetrable to atomic products for the decomposition of a gas by the generated plasma, while minimizing penetration of ionic products of such decomposition. For example, when a gas decomposed by the generated plasma is a fluorine containing gas, such as $NF_3$, grounded electrode assembly 802 may be penetrable to atomic products of the fluorine containing gas decomposition, while minimizing penetration of ionic products of such decomposition. This may mean that a concentration of the atomic products of the fluorine containing gas decomposition in area 807 between grounded electrode assembly 802 and substrate 818 may be at least 10 times or at least 20 times or at least 50 times or at least 100 times or at least 200 times or at least 500 times or at least 1000 times higher than a concentration of the ionic products of the fluorine containing gas decomposition in the same area. When a gas decomposed by the generated plasma is molecular hydrogen, grounded electrode assembly 802 may be penetrable to atomic hydrogen, while minimizing penetration of ionic products of the molecular hydrogen decomposition. This may mean that a concentration of the atomic hydrogen in area 807 between the grounded electrode assembly and the substrate holder 801 may be at least 10 times or at least 20 times or at least 50 times or at least 100 times or at least 200 times or at least 500 times or at least 1000 times higher than a concentration of the ionic products of the molecular decomposition in the same area.

In many embodiments, grounded electrode assembly 802 may have a plurality of perforations. Such perforations may have regular, such as a circle, oval or rectangular, or irregular shapes. Preferably, a critical dimension, such as a diameter, of each of the perforations is at least 1 mm, at least 2 mm or at least 2.1 mm or at least 2.2 mm or at least 2.3 mm or at least 2.4 mm or at least 2.5 mm or at least 2.6 mm or at least 2.7 mm or at least 2.8 mm or at least 2.9 mm or at least 3.0 mm. Using perforations of such dimensions may prevent penetration of direct plasma from an area between the showerhead electrode and the grounded electrode assembly to an area between the grounded electrode assembly and the substrate. In some embodiments, grounded electrode 804 may be an aluminum mesh or grid. In some embodiments, cleaning chamber or module 800 may be such that a distance between substrate 818 (or substrate holder 801) and grounded electrode 804 (or grounded electrode assembly 802) is adjustable. Adjusting this distance may allow one to control an intensity or density at the substrate surface of dry-etching by fluorine containing species produced through the decomposition of the fluorine containing gas by plasma generated between showerhead electrode 803 and grounded electrode 804 and/or an intensity or density of exposure to atomic hydrogen produced through decomposing hydrogen by the generated plasma. This adjustable distance between substrate holder 801 (or substrate 818) and ground electrode 802 is shown in FIG. 2 by area 807. This may be accomplished by adjusting a height of heater 801.

In some embodiments, cleaning chamber or module 800 may have one or more plenums configured to keep a gas before it enters plasma area 808. FIG. 4 schematically illustrates cleaning chamber or module 800 having multiple, i.e. two or more, gas plenums. For example, plenum 815 may be configured to keep a first gas, which may be, for example, HF, before it enters plasma area 808, while plenum 816 may be configured to keep a nth gas, which may be, for example, $H_2O$. before it enters plasma area 808, wherein n is an integer greater than 1, i.e. 2, 3 etc. Thus, the nth plenum may be, example $2^{nd}$ plenum, $3^{rd}$ plenum, $4^{th}$ plenum or a higher order plenum. In some embodiments, individual gases may enter directly from their respective gas plenums to plasma area 808. Yet in some embodiments, two or more individual gases may be mixed prior to entering plasma area 808. For example, FIG. 4 shows mixing plenum 817, in which individual gases from gas plenums, such as plenums 815 and 816, may be mixed, before entering plasma area 808. In such a case, the gas plenums, such as plenums 815 to 816, may be separated and no mixing of gases inside these gas plenums is allowed until the gases are introduced into mixing plenum 817. The multi-plenum configuration in FIG. 4, is not limited to two gases, i.e. more than two gases may be used. For example, more than two gases from more than two separate gas plenums may be mixed in mixing plenum 817 before the resulting gas mixture enters plasma area 817. In some embodiments, cleaning chamber or module 800 may further comprises body 810 and electrically insulating plate 811 configured to electrically insulate the body from the showerhead electrode 803. Such electrically insulating plate may be, for example, a ceramic plate.

In some embodiments, the discussed above cleaning chamber may operate by itself as a single piece of equipment.

Yet in some other embodiments, the discussed above cleaning chamber may be a part of a larger apparatus, which may also comprise i) an epitaxial deposition module configured to epitaxially deposit a semiconductor layer on the substrate treated in the cleaning chamber and ii) a transfer module configured to transfer the substrate from the cleaning chamber to the epitaxial deposition module. For example, the discussed above cleaning chamber may serve as cleaning module 101 in apparatus 100 presented in FIG. 1. Besides the cleaning chamber, the epitaxial deposition module and the transfer module, the larger apparatus may also include a loading module configured to transfer a semiconductor substrate, for which epitaxial deposition is desired, from an atmospheric pressure outside environment to a lower pressure environment of the transfer module and/or to transfer a semiconductor substrate treated in one or more modules of the apparatus, such a substrate with an epitaxially deposited layer, from the lower pressure environment of the transfer module back to the atmospheric pressure outside environment.

Embodiments described herein are further illustrated by, though in no way limited to, the following working examples.

WORKING EXAMPLES

Typical conditions for dry etching of silicon wafers by fluorine containing species formed through decomposing $NF_3$ gas using plasma are described below. The plasma used for decomposing $NF_3$ was not in direct contact with etched wafers. For this experiment a set of 300 mm diameter silicon wafers were thermally oxidized to generate a uniform $SiO_2$ layer on the surface with a thickness of 2000 Å. Thickness of the oxide layer was measured using an ellipsometer prior to any etching. Each wafer was processes through a cleaning process using $NF_3$ and Ar gas using an $NF_3$/Ar ratio of 1:1 or 1:4. For all conditions, the wafer temperature was held constant at 450° C. and the process pressure and power to the remote plasma generator was constant at 2 Torr. The etching rate was controlled using Ag dilution of the $NF_3$ gas. After etching, the thickness of the silicon oxide layer was measured using an ellipsometer. The etch amount was calculated by subtracting the initial oxide thickness from the final oxide thickness. Plots of etch amount vs etch time for the two different $NF_3$/Ar ratios are shown in FIG. 3.

Typical process conditions evaluated for hydrogen plasma treatment of silicon substrates are described below. Bare silicon coupons 1" square were exposed to hydrogen atoms produced by decomposing molecular hydrogen using pulsed DC plasma. Prior to exposure, all substrates were hydrophilic as measured by water contact angle indicating an oxidized surface. The process conditions were held constant while the process time was varied. For processing, the coupons were placed on a heater set to 600° C. in an $H_2$ ambient. A plasma was ignited using 120W 11 kHz power supply. The process time was varied from 2 minutes to 64 minutes. After the samples were removed from the process chamber, the presence of an oxide layer on the surface was tested using a water contact angle test. For process times of 4 minutes and above, the surface became hydrophobic, indicating the removal of native oxide. The plasma used for decomposing molecular hydrogen was not in direct contact with etched wafers (remote plasma). The process conditions during experiments was held constant at 6 mbar.

Wetting properties for a silicon substrate, which was not exposed to the plasma treatment, and a silicon substrate, which was treated with hydrogen decomposed by the remote plasma at 600° C. were compared. The untreated substrate has a hydrophilic surface, while the substrate, which was treated with hydrogen decomposed by the remote plasma at 600° C. has a hydrophobic surface.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention. All of the publications, patent applications and patents cited in this specification are incorporated herein by reference in their entirety.

What is claimed is:

1. A method of epitaxial deposition comprising
   a) obtaining a semiconductor substrate having i) a bulk semiconductor and ii) a surface oxide layer over the bulk semiconductor;
   b) dry-etching the substrate with a fluorine containing species to remove the surface oxide layer and thereby expose a surface of the bulk semiconductor;
   c) exposing the surface of the bulk semiconductor to hydrogen atoms; and
   d) then epitaxially depositing a semiconductor layer on the surface of the bulk semiconductor.

2. The method of claim 1, wherein the semiconductor substrate is a silicon substrate.

3. The method of claim 1, wherein the epitaxially deposited semiconductor layer is a Group III-V semiconductor layer.

4. The method of claim 1, wherein after said exposing and before said depositing the surface of the bulk semiconductor is not exposed to water vapor, oxygen or adventitious carbon.

5. The method of claim 1, wherein said dry etching comprises decomposing $NF_3$ to produce said fluorine containing species using plasma.

6. The method of claim 5 wherein said dry-etching is performed at a temperature of the substrate being from 130 to 650° C.

7. The method of claim 5, wherein no direct plasma is in direct contact with the substrate during the dry-etching.

8. The method of claim 1, wherein said exposing comprises decomposing $H_2$ by a plasma to produce said hydrogen atoms.

9. The method of claim 8, wherein no direct plasma is in direct contact with the substrate during the exposing of the substrate to the hydrogen atoms.

10. The method of claim 1, wherein said exposing is performed at a first elevated temperature and said epitaxially depositing is performed at a second elevated temperature and wherein the method comprises cooling the substrate from the first elevated temperature after said exposing and then heating the substrate to the second elevated temperature.

11. The method of claim 1, wherein during said dry-etching, exposing and epitaxially depositing a temperature of the substrate is at least 200° C.

12. The method of claim 1 performed in an apparatus comprising i) a cleaning module; ii) a epitaxial deposition module; and iii) a transfer module in direct contact with the cleaning module and the epitaxial deposition module; wherein said dry-etching and said exposing are performed in the cleaning module and said epitaxially depositing is performed in the epitaxial deposition module, wherein the method further comprises removing the substrate from the cleaning module to the transfer module after said exposing and then transferring the substrate from the transfer module to the epitaxial deposition module.

13. The method of claim 12, wherein the cleaning module comprises a heater and each of the dry etching and the exposing comprises heating the substrate by the heater.

14. The method of claim 12, wherein the cleaning module comprises a plasma chamber and wherein said dry-etching comprises generating plasma in the plasma chamber to produce the fluorine containing species, while said exposing comprises generating plasma in the plasma chamber to produce said hydrogen atoms.

15. The method of claim 14, wherein the plasma chamber is such that the plasma is generated in a uniform region, which is not in direct contact with the substrate.

16. The method of claim 15, wherein the plasma chamber is a parallel plate cavity comprising i) a showerhead electrode configured to introduce a gaseous species, said showerhead electrode is positioned above the substrate parallel to a surface of the substrate; and ii) a grounded shield plate, which is penetrable by said fluorine containing species and said hydrogen atoms, the ground plate being positioned parallel to the surface of the substrate between the showerhead electrode and the substrate; wherein the uniform region, in which the plasma is generated, is between the showerhead electrode and the grounded shield electrode and wherein no direct plasma is present between the grounded shield electrode and the substrate.

17. The method of claim 16, wherein said dry etching comprises introducing $NF_3$ through the showerhead electrode into a space between the showerhead electrode and the grounded shield plate; and generating plasma between the showerhead electrode and the grounded shield plate to produce the fluorine containing species by decomposing $NF_3$.

18. The method of claim 16, wherein said exposing comprises introducing $H_2$ through the showerhead electrode into a space between the showerhead electrode and the grounded shield plate; and generating plasma between the showerhead electrode and the grounded shield plate to produce the hydrogen atoms by decomposing $H_2$.

19. The method of claim 14, wherein the plasma chamber is a parallel plate cavity comprising i) a showerhead electrode configured to introduce a gaseous species, said showerhead electrode is positioned above the substrate parallel to a surface of the substrate; and ii) a substrate holder configured to hold the substrate, the substrate holder comprising a heater, which comprises a grounded mesh and an electrically insulating surface above the grounded mesh, wherein plasma is generated in the plasma chamber between the grounded mesh and the showerhead electrode.

20. The method of claim 1, further exposing the substrate to hydrogen atoms prior to said dry etching.

* * * * *